(12) United States Patent
Chang

(10) Patent No.: US 6,323,657 B1
(45) Date of Patent: Nov. 27, 2001

(54) CONDUCTOR TESTER

(75) Inventor: Chen-Tsai Chang, Taipei Hsien (TW)

(73) Assignee: Dintek Electric Limited, Taipei Hsien (TW)

( * ) Notice: Subject to any disclaimer, the term of this patent is extended or adjusted under 35 U.S.C. 154(b) by 0 days.

(21) Appl. No.: 09/453,441

(22) Filed: Dec. 3, 1999

(51) Int. Cl.[7] .............................. G01R 1/04; G01R 31/02
(52) U.S. Cl. ........................ 324/539; 324/543; 324/556; 324/156
(58) Field of Search .................................. 324/539, 540, 324/542, 543, 555, 556, 156; 73/431; 220/4.02; 24/335, 575

(56) References Cited

U.S. PATENT DOCUMENTS 4,959,792 * 9/1990 Sullivan ........................ 324/555 X
5,448,162 * 9/1995 Beha ................................ 324/72.5
5,477,152 * 12/1995 Hayhurst ........................... 324/542

* cited by examiner

Primary Examiner—Glenn W. Brown
(74) Attorney, Agent, or Firm—Rosenberg, Klein & Lee

(57) ABSTRACT

A conductor tester including two contour-identical parts of a main unit and a remote unit is used to test and indicate present condition of conductors. Both the main and the remote units are formed at two ends with high and low raised portions that are provided with fastening means for the two units to detachably connect to each other to form a compact unit. The high and low raised portions are provided at side walls with notches that are electrically connected to internal circuits of the main and the remote units, and at inner walls between the high and low raised portions with light-emitting diodes. By connecting the main and/or the remote unit at two notches thereof to two ends of one or more conductors, internal circuits of the main and/or the remote unit are brought to contact with the conductor or conductors, causing one or more of the light-emitting diodes to light to indicate present conditions of the conductor or conductors, such as short circuit, open circuit, reverse connection, wrong connection, etc.

1 Claim, 4 Drawing Sheets

CONDUCTOR TESTER

BACKGROUND OF THE INVENTION

The present invention relates to a conductor tester, and more particularly to a conductor tester having light-emitting diodes for conveniently indicating present conditions of tested conductors.

An electrician would usually check conductors in a newly completed wiring system for general electric equipment or computer systems through direct trial runs of the equipment or computer systems, so that correct connection of the conductors and/or normal data transmission over the wiring system can be ensured. In the case any disorder in data transmission over the wiring system is found, the electrician would use an instrument to test two ends of each conductor in the wiring system for correct make thereof.

However, there is not any effective way or instrument currently available for detecting any problems, such as open circuit, reverse connection and incorrect connection, possibly existing among conductors, particularly for detecting of normal data transmission over conductors between two ends of the wiring system. The only way to find out transmission problems among conductors in a wiring system is, therefore, to check the conductors one by one or even have the whole wiring system repaired. It is, of course, extremely time and labor consuming and inefficient to do so. Thus, it is desirable to have an improved conductor tester developed to solve the problems existing in the checking of conductors among a wiring system.

SUMMARY OF THE INVENTION

A primary object of the present invention is to provide a conductor tester that is suited for testing either one single conductor or a number of conductors included in a wiring system.

Another object of the present invention is to provide a conductor tester that is provided with means to conveniently indicate directly on the tester any test result.

A further object of the present invention is to provide a conductor tester that includes two separable working units that can be connected to each other to form a compact unit and automatically switch off when the conductor tester is not in use.

To achieve the above and other objects, the conductor tester of the present invention mainly includes two contour-identical parts of a main unit and a remote unit. Both the main and the remote units are formed at two ends with high and low raised portions that are provided with fastening means for the two units to detachably connect to each other to form a compact unit. The high and low raised portions are provided at side walls with notches that are electrically connected to internal circuits of the main and the remote units, and at inner walls between the high and low raised portions with light-emitting diodes. By connecting the main and/or the remote unit at two notches thereof of two ends of one or more conductors, internal circuits of the main and/or the remote unit are brought to electrically contact with the conductor or conductors, causing one or more of the light-emitting diodes to light to indicate present conditions of the conductor or conductors, such as short circuit, open circuit, reverse connection, wrong connection, etc.

Moreover, the main unit and the remote are internally provided with magnetic reed switches and magnetic elements, such that when the main and the remote units are closely connected to each other to form a compact body, the magnetic reed switches in the two units magnetically attract to bring the main and the remote units in an off state, and when the main and the remote units are separated from each other, the magnetic reed switches are caused to make and thereby automatically switch on the main unit and the remote unit.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
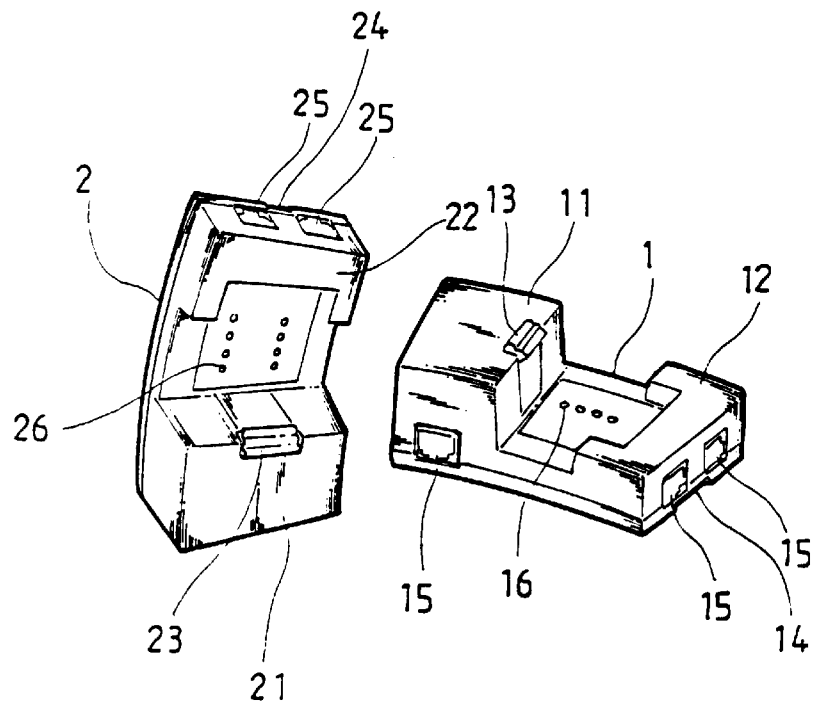
FIG. 1 is a perspective of a conductor tester according to the present invention wherein a main unit and a remote unit thereof are separated from each other.
Figure 2:
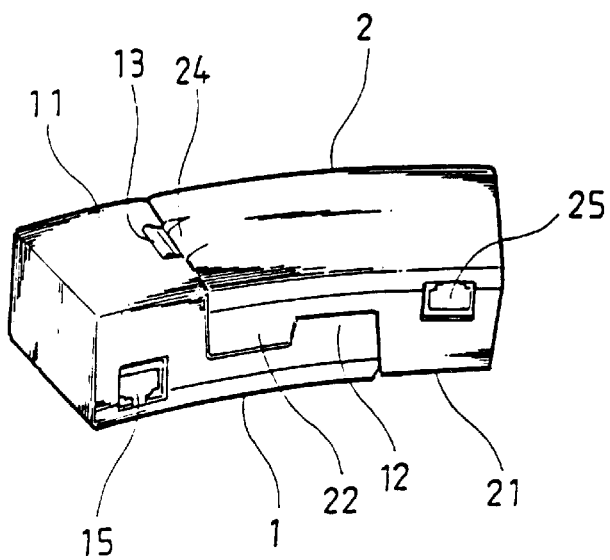
FIG. 2 is a perspective of the conductor tester of FIG. 1 with the main unit and the remote unit connected to each other to form a compact unit.

Please refer to FIGS. 1 and 2 at the same time. A conductor tester according to the present invention includes two contour-identical parts of a main unit 1 and a remote unit 2. The two units 1 and 2 are formed at two ends with high and low raised portions 11, 12 and 21, 22, respectively. The high raised portions 11 and 21 are provided at top inner middle points with fastening means 13 and 23, respectively, and the low raised portions 12 and 22 are provided at bottom outer middle points with catchers 14 and 24, respectively, so that the main unit 1 can be turned upside down to superpose on and connect to the remote unit 2 to form a compact unit by engaging the fastening means 13 and 23 with the catchers 24 and 14, respectively. Moreover, both the main unit 1 and the remote unit 2 are internally provided with magnetic reed switches and magnetic elements, such that the two units 1, 2 are in the off state when they are closely connected to each other. When the two units 1, 2 are separated from each other, the magnetic reed switches are caused to make and thereby switch on the main unit 1 and the remote unit 2.

The high and low raised portions 11, 12 and 21, 22 on the main and the remote units 1 and 2 are also provided at side walls with notches 15 and 25, respectively, that are electrically connected to internal circuits of the two units 1 and 2.

One or more rows of light-emitting diodes 16 and 26 are provided on inner walls on the units 1 and 2 between the high and the low raised portions. Connection of conductors to the notches 15, 25 would bring the internal circuits of the units 1, 2 to make contact with the conductors and thereby test the latter. The light-emitting diodes 16, 26 would indicate different conditions of the tested conductors, such as short circuit, open circuit, reverse connection, wrong connection, etc.

Figure 3:
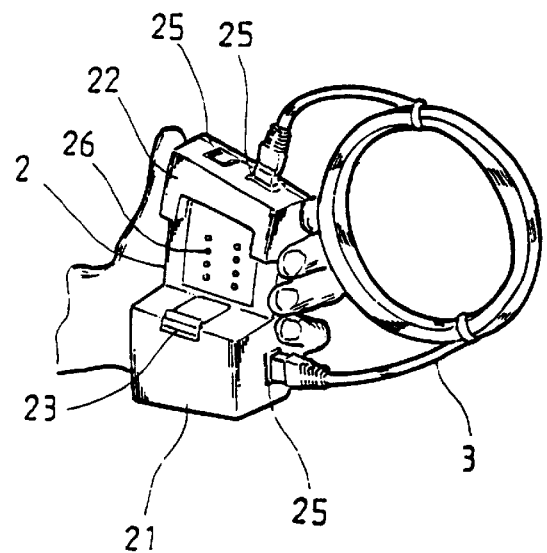
FIG. 3 illustrates the remote unit of the conductor tester of the present invention being used to test one single conductor.

Please refer to FIG. 3. When a single conductor 3 is to be tested with the conductor tester of the present invention, the remote unit 2 is separated from the main unit 1 for conveniently holding with one hand. Connect two ends of the conductor 3 to two notches 25 on the remote unit 2. One or more of the light-emitting diodes 26 on the inner wall of the remote unit 2 immediately light to indicate a present condition of the tested conductor 3, such as short circuit, open circuit or normal operation.

Figure 4:
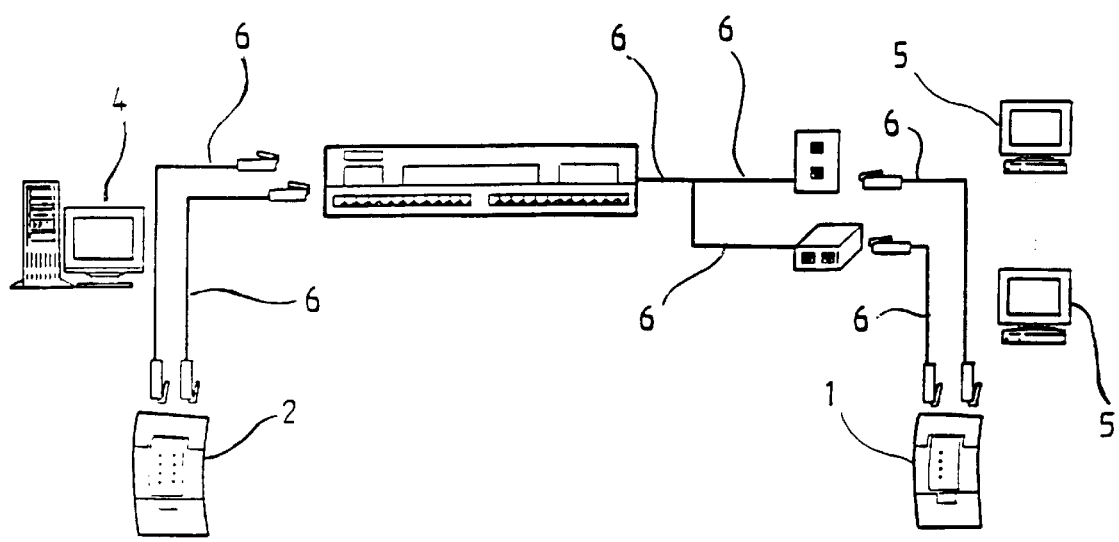
FIG. 4 illustrates the conductor tester of the present invention being used to test electrical connection of conductors in a wiring system.

FIG. 4 illustrates the manner of using the conductor tester of the present invention to test a number of conductors 6 included in a general wiring system. To do this, the main unit 1 and the remote unit 2 are separated from each other for working at two different ends, for example, a terminal end 5 and a console display end 4, respectively. The conductors 6 are sequentially connected at two ends to notches 15 and 25 on the main unit 1 and the remote unit 2, respectively. One or more of the light-emitting diodes 16 and 26 on the two units 1 and 2 would light to indicate exact data transmission state over the tested wiring system and to detect any problem, such as reverse connection, incorrect connection and the like, possibly existing on the tested conductors 6. That is, the conductor tester of the present invention can be used to test conductors at two remotely spaced ends in a wiring system.

Figure 5:
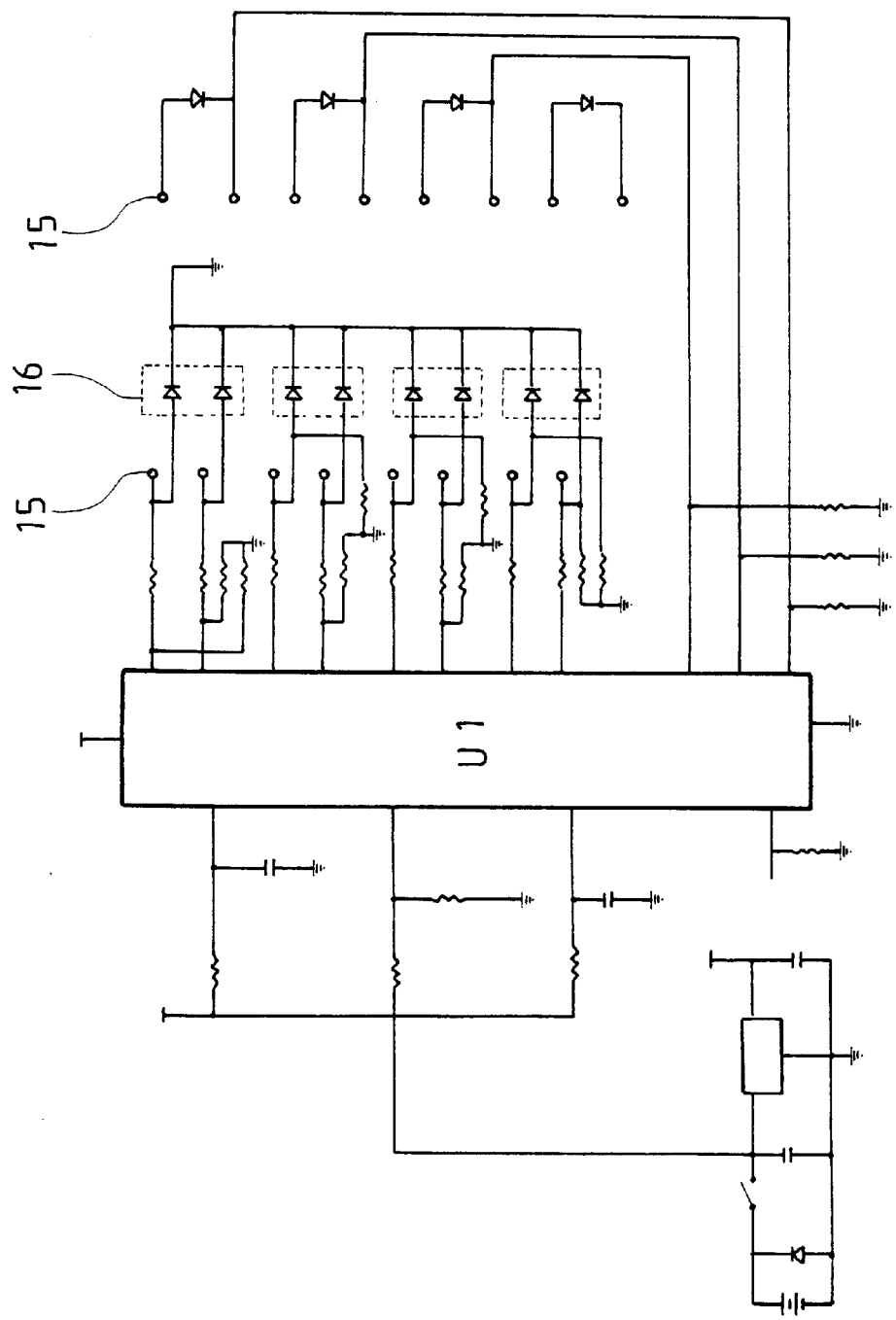
FIG. 5 is a circuit diagram of the main unit of the present invention.

FIG. 5 is a circuit diagram of the main unit 1 of the present invention. As shown, the main unit 1 includes a chip integrated circuit U1 that generates testing signals and sends the same to notches 15. Outputs of the chip integrated circuit U1 are connected to differently colored light-emitting diodes 16. When the testing signals are fed back via the conductor 6, one or more of the light-emitting diodes 16 light to indicate whether the conductor 6 is in an open-circuited, short-circuited, reversely connected or incorrect connected state.

Figure 6:
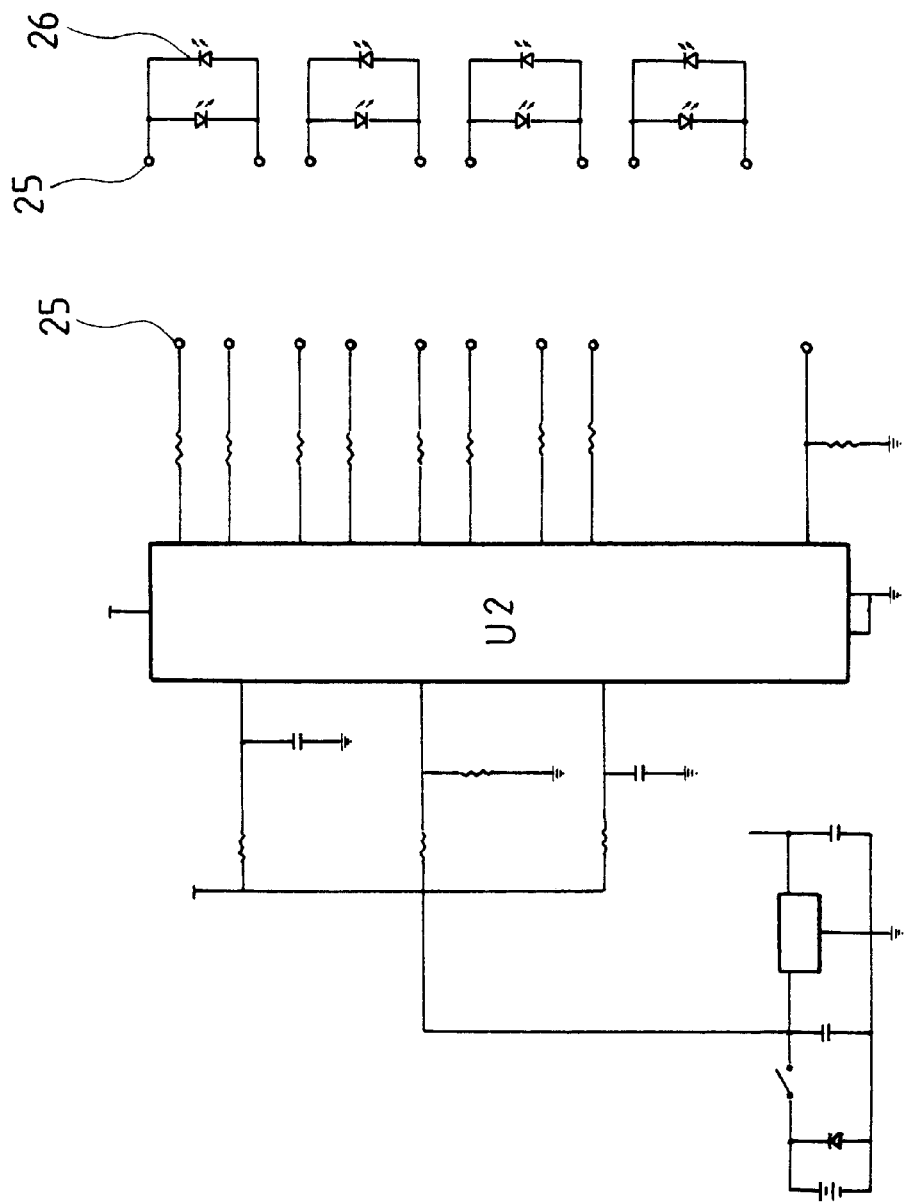
FIG. 6 is a circuit diagram of the remote unit of the present invention.

FIG. 6 is a circuit diagram of the remote unit 2 of the present invention. The remote unit 2 also includes a chip integrated circuit U2 that is equivalent to the chip integrated circuit U1 of the main unit 1. The chip integrated circuit U2 generates testing signals and sends the same to notches 25. Outputs of the chip integrated circuit U2 are connected to differently colored light-emitting diodes 26. When the testing signals are fed back via the conductor 6, one or more of the light-emitting diodes 26 light to indicate an exact working condition of the conductor 6.

What is claimed is:

1. A conductor tester comprising two contour-identical parts of a main unit and a remote unit, both of said main and said remote units being respectively formed at two ends thereof with high and low raised portions, said high raised portions being provided at top inner middle points with fastening means and said low raised portions being provided at bottom outer middle points with catchers so that said main unit can be turned upside down to superpose on and connect to said remote unit to form a compact unit by engaging said fastening means on one of said two units with said catchers on the other said unit; said high and said low raised portions respectively being provided at side walls thereof with notches that are electrically connected to respective internal circuits of said main and said remote units; and an inner wall of each of said main unit and said remote unit having at least one row of light-emitting diodes provided thereon between said high and said low raised portions; whereby by separately connecting said main and said remote units at notches thereof to conductors at two remotely spaced ends of a wiring system, said internal circuits of said main and said remote units are brought into contact with said conductors, and at least one of said light-emitting diodes lights to indicate different conditions of said conductors connected to said main and said remote unit.

* * * * *